United States Patent [19]

Marcuard

[11] Patent Number: 5,307,020
[45] Date of Patent: Apr. 26, 1994

[54] PHASE COMPARATOR DEVICE WITH WIDE DYNAMIC RANGE

[75] Inventor: Alain Marcuard, Elancourt, France

[73] Assignee: Thomson-CSF, Puteaux, France

[21] Appl. No.: 853,814

[22] Filed: Mar. 19, 1992

[30] Foreign Application Priority Data

Mar. 22, 1991 [FR] France ................ 9103501

[51] Int. Cl.⁵ ............... H03K 9/06; H03K 5/00; H03K 5/159; H03L 7/00
[52] U.S. Cl. ................... 328/133; 328/151; 328/155; 307/262; 307/511; 307/523; 307/353
[58] Field of Search .......... 328/133, 155, 156, 151; 307/262, 510, 511, 516, 525, 529, 353, 523

[56] References Cited

U.S. PATENT DOCUMENTS

| 4,458,214 | 7/1984 | Lakomy | 331/1 A |
|-----------|--------|--------|---------|
| 4,543,542 | 9/1985 | Owen | 331/23 |
| 4,675,885 | 6/1987 | Gagliardi et al. | 328/155 |
| 4,709,237 | 11/1987 | Poullain et al. | 342/203 |
| 4,728,884 | 3/1988 | Gumm | 328/133 |
| 4,890,248 | 12/1989 | Reinhardt | 307/523 |

FOREIGN PATENT DOCUMENTS 0240232  10/1987  European Pat. Off. .
0256637   2/1988  European Pat. Off. .

OTHER PUBLICATIONS

International Journal of Electronics, vol. 49, No. 4, Oct. 1980, London GB, pp. 333-337, M. Emura, et al., "Wide Dynamic Range Phase-Comparator Using an Analogue Shift Register".

Patent Abstracts of Japan, vol. 11 No. 374 (E-562)(2821), Dec. 5, 1987, & JP-A-62 142429, Jun. 25, 1987, M. Fujita, "Phase Locked Loop".

Primary Examiner—William L. Sikes
Assistant Examiner—Trong Phan
Attorney, Agent, or Firm—Oblon, Spivak, McClelland, Maier & Neustadt

[57] ABSTRACT

The phase comparator device with wide dynamic range comprises a phase comparator with reduced dynamic range to carry out the measurement, on a limited phase range, of the phase difference existing between an incident signal and an external reference signal modulated by a controlled phase signal generator. The device comprises, firstly, a phase accumulation circuit coupled to the output of the phase comparator for the successive accumulation, at determined instants, of the phase differences measured by the phase comparator and actuate the controlled phase signal generator so that its phase permanently follows the value of the phase differences cumulated in the accumulation circuit and, secondly, an adder circuit coupled to the output of the phase accumulation circuit and to the output of the comparator to add the phase difference measured by the phase comparator to the contents of the accumulation circuit. Application: phased carrier tracking loop for satellite navigation receiver.

4 Claims, 1 Drawing Sheet

PHASE COMPARATOR DEVICE WITH WIDE DYNAMIC RANGE

BACKGROUND OF THE INVENTION

1. Field of the Invention

The present invention relates to a phase comparator with a wide dynamic range that can be used in a phase locked loop.

It can be applied notably to the making of loops for the computing of delta pseudo-distances in satellite radio-navigation receivers.

2. Description of the Prior Art

A phase locked loop is formed, in a standard way, by three elements consisting of a variable frequency local oscillator known by the abbreviations VCO, a phase comparator to discriminate the phase difference between the signal given by the local oscillator and an incident signal, an amplifier and a loop filter controlling the frequency of the local oscillator on the basis of the phase difference given by the phase comparator.

With a loop such as this, the frequency of the oscillator is no longer controlled efficiently either because the level of the incident signal diminishes, when the signal-to-noise ratio is excessively low in the passband defined by the loop filter or because the phase dynamic range of the phase comparator, namely its ability to give a valid signal when the phase difference between the reference signal and the incident signal is great, is exceeded by the phase swings of the signal.

Under these conditions, to obtain high quality measurements on a noise-infested incident signal or on a signal of low value, it is necessary to reduce the passband of the phase locked loop. This is done by increasing the filtering time constant, but then the trailing of the loop at the phase variations between the incident signal and the reference signal is increased and, to prevent a stalling of the loop, the phase comparator should be capable of accepting operation with major phase differences.

However, known phase comparators of the exclusive-OR, tangent or cotangent type limit the phase difference between the incident signal and the reference signal to a few radians. For greater swings, this leads to the use of comparators of non-linear transfer functions, thus greatly complicating the making of the device, and generally causes the loss of the information on phase difference for a limited period of time.

The aim of the invention is to overcome the above-mentioned drawbacks.

SUMMARY OF THE INVENTION

To this effect, an object of the invention is to provide a phase comparator device with a wide dynamic range for a phase locked loop comprising a phase comparator to carry out the measurement, on a determined phase range, of the phase difference existing between an incident signal and a local reference signal given by a controlled phase signal generator, wherein said device comprises, firstly, a phase accumulation circuit coupled to the output of the phase comparator for the successive accumulation, at determined instants, of the phase differences measured by the phase comparator and actuation of the controlled phase signal generator so that its phase permanently follows the value of the phase differences cumulated in the accumulation circuit and, secondly, an adder circuit coupled to the output of the phase accumulation circuit and to the output of the comparator to add the phase difference measured by the phase comparator to the contents of the accumulation circuit.

The phase comparator device according to the invention has the advantage of making it possible to obtain a dynamic range of phase that can be extended at will and that has a perfectly linear monotonous transfer characteristic which simplifies the computation of the phase locked loops and makes it possible never to lose the information on phase difference in the loop.

BRIEF DESCRIPTION OF THE DRAWINGS

Other features and advantages of the invention shall appear here below from the following description made with reference to the appended drawings, of which.

MORE DETAILED DESCRIPTION

Figure 1:
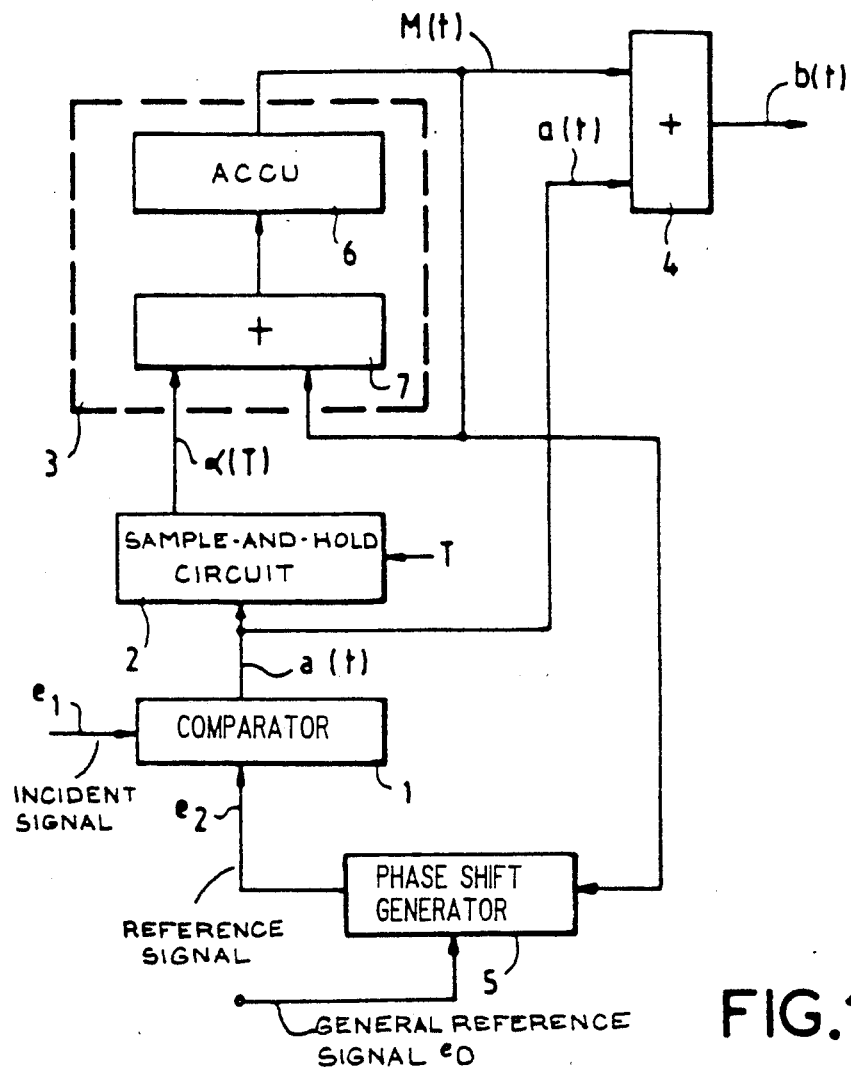
FIG. 1 shows an embodiment of a phase comparator device according to the invention.

The phase comparator device of the invention, shown in FIG. 1, has a phase comparator 1 coupled by means of a sample-and-hold circuit 2 to a phase accumulation circuit 3 shown within a box of dashes. It also includes an adder circuit 4 with two operand inputs respectively connected to the output of the accumulation circuit 3 and to the output of the phase comparator 1, as well as to a phase shift generator controlled by the output of the accumulation circuit 3 converting the general reference signal $e_0$ into a local reference signal $e_2$.

The phase comparator 1 may be formed by any type of standard exclusive-OR circuit capable of carrying out the linear measurement of a phase difference, for example ranging from + to − 45 degrees, between two inputs of clipped signals $e_1$ and $e_2$. The input $e_1$ receives the incident signal and the input $e_2$ of the phase comparator 1 receives the general reference signal corrected by the phase differences or phase shifts given by an output of the generator 5.

The accumulation circuit 3 includes, in a known way, an accumulator register 6 looped to its input by means of a first operand input of an adder circuit 7, the second operand input of the adder circuit 7 being connected to the output of the sample-and-hold circuit 2.

The accumulation circuit 3 joined to the adder circuit 4 and to the phase shift generator 5 enables the entire device to give a continuously variable phase difference independently of the variably reduced phase dynamic range of the comparator circuit 1.

Indeed, by programming the generator 5 in such a way that the phase obtained at its output is equal to the phase memorized in the accumulator register 6, loading the phase difference $a_o$, existing between the two phase comparator 1 inputs of the signals $e_1$ and $e_2$, into the accumulator register 6 at an initialization instant $t = t_0$ is enough to cancel the phase difference between the comparator 1 inputs of the signals $e_1$ and $e_2$.

Figure 2:
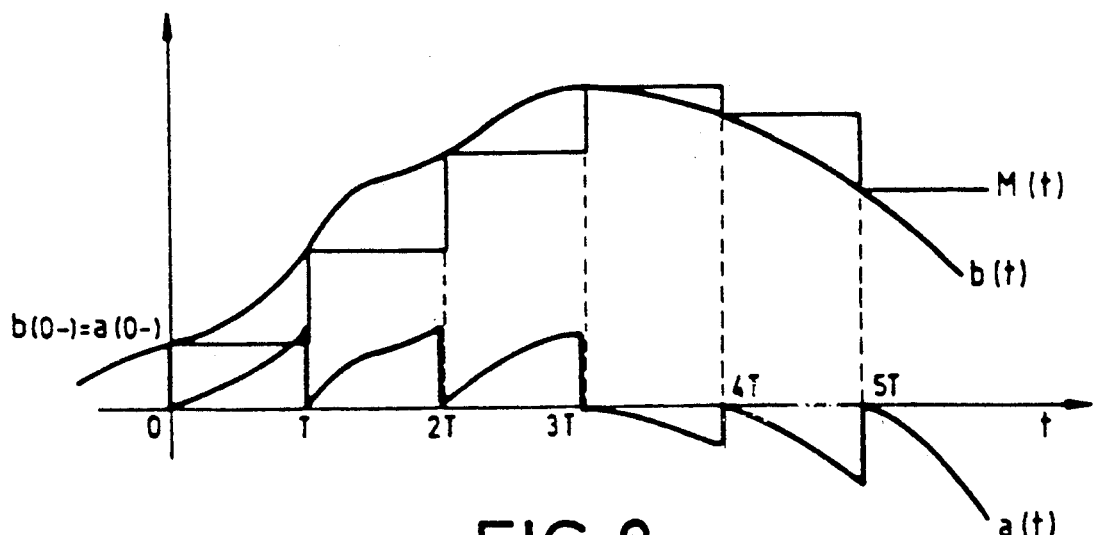
FIG. 2 is a graph showing the development, as a function of time, of signals a(t), b(t) and M(t) characteristic of the embodiment of FIG. 1.

At an instant $t_0 + T$ later, the phase difference $a_0$ becomes $a(T)$. This value $a(T)$ is then sampled as shown in FIG. 2 by the sample-and-hold circuit 2 and is then applied to the second operand input of the adder circuit 7. The value $a(T)$ is then added to the contents M of the accumulator register 6. The quantity $M = M + a(T)$ thus obtained is applied to the input of the generator 5 and the phase difference a(T) that corresponds to it is, in turn, applied to the second operand input $e_2$ of the comparator circuit 1. This results in a resetting of the signal a(t), obtained at the output of the comparator circuit 1, at zero. Meanwhile, the output of the adder circuit 4 gives a signal b(t)=M+a(t) representing the addition of the difference a(t) to the contents M of the register 6. The advantage is that the latter operation does not bring out any discontinuity on the variable b(t) for, if the phase difference a(T) at the output of the comparator circuit 1 goes from the value a(t) to the value 0, the contents of the accumulator register 6 go from M(T) to M(T)+a(T). Thus, although the variable a(t) is discontinuous, the variable representing the phase difference b(t) obtained at the output of the adder circuit 4 always appears to be continuous. As shown in FIG. 2, just prior to time t=0 the signal b(t) and a(t) are equal. At time t=0, however, signal a(t) shows a discontinuity while signal b(t) remains continuous.

Naturally, the above computations can be started again at each new period of time T. The aim of these operations is clearly to limit the phase swing during the period T between the comparator 1 inputs of the signals $e_1$ and $e_2$ to a value compatible with its real dynamic range, and the entire value of T meeting this condition may be appropriate. Consequently, during the construction for example of a phase locked loop, the period T should be chosen as a function of the characteristics of the filter of the phase loop so that the development of the difference between the incident phase and the reference phase does not exceed 45° in terms of absolute value during each observation interval T. Another possible approach would be to actuate the sample-and-hold circuit automatically when the value of a(t) reaches a pre-set limit, thus economizing on the external clock with a period T. As a rule, the duration of T could be chosen so as to be very low as compared with the filtering time constants, in order to bring into play only the phase dynamic range characteristics of the incident signal.

The dynamic range of the phase comparator device that has just been described is limited only by the memorization capacity of the accumulator register 6 and by the possibilities of the adder 4. However, it is very easy to determine the size of these two elements with a number of bits such that the dynamic range of the comparator can reach several tens of thousands of rotations so that, in practice, there is no longer any need to consider any dynamic limitation in phase due to the phase comparator.

Naturally, should it be necessary to preserve the information on amplitude of the incident signal through the phase comparator device according to the invention, as is done for example in a Costas loop, a detection of the amplitude of the signal on the first operand input of the phase comparator 1 may be done before the incident signal $e_1$ is shaped by clipping. The amplitude information can then be given by the modulation, by the phase angle b(t) obtained at the output of the adder circuit, of the amplitude information detected, for the information given to the accumulator circuit 3 and to the adder circuit 4 then represents only the phase of the signal and not its amplitude.

What is claimed is:

1. A phase comparator device with wide dynamic range for a phase-locked loop comprising a phase comparator to carry out the measurement, on a determined phase range, of the phase difference existing between an incident signal and a local reference signal output by a controlled phase signal generator and input into said phase comparator, wherein said device comprises, firstly, a phase accumulation circuit coupled to the output of the phase comparator by means of a sample-and-hold circuit for the successive accumulation, at determined instants, of a plurality of successive phase differences measured by the phase comparator and actuation of the controlled phase signal generator so that the phase of the local reference signal is varied in accordance with the accumulated value of the plurality of successive phase differences stored in the accumulation circuit and, secondly, an adder circuit coupled to the output of the phase accumulation circuit and to the output of the comparator to add the phase difference measured by the phase comparator to the contents of the accumulation circuit.

2. A device according to claim 1, wherein the phase accumulation circuit includes an accumulator register loaded by the output of an adder circuit with two operand inputs, the first operand input being connected to the output of the sample-and-hold circuit and the second operand input being connected to the output of the accumulator register.

3. A device according to claim 1, wherein the sample-and-hold circuit is controlled either by an external clock with a fixed period T or by a device ascertaining that a value a(t), representing a time-varying difference between said incident signal and said local reference signal, does not exceed, in absolute value, a limit $a_o$ defined by the characteristic dynamic range of the comparator.

4. A device according to claim 1, wherein an output of said phase accumulation circuit is coupled directly to an input of said controlled phase signal generator in order to control the phase of the local reference signal.

* * * * *